United States Patent
Lee et al.

(10) Patent No.: US 9,590,198 B2
(45) Date of Patent: *Mar. 7, 2017

(54) INTEGRATED CONDUCTIVE SUBSTRATE, AND ELECTRONIC DEVICE EMPLOYING SAME

(71) Applicant: POSTECH ACADEMY—INDUSTRY FOUNDATION, Pohang-si, Gyeongsangbuk-do (KR)

(72) Inventors: TaeWoo Lee, Pohang-si (KR); YoungHoon Kim, Daejeon (KR)

(73) Assignee: POSTECH ACADEMY—INDUSTRY FOUNDATION, Pohang-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/394,069

(22) PCT Filed: Apr. 10, 2013

(86) PCT No.: PCT/KR2013/003008
§ 371 (c)(1),
(2) Date: Oct. 10, 2014

(87) PCT Pub. No.: WO2013/154354
PCT Pub. Date: Oct. 17, 2013

(65) Prior Publication Data
US 2015/0075606 A1     Mar. 19, 2015

(30) Foreign Application Priority Data

Apr. 10, 2012 (KR) .......... 10-2012-0037585
Apr. 10, 2013 (KR) .......... 10-2013-0039341

(51) Int. Cl.
*H01L 51/00* (2006.01)
*H01L 51/44* (2006.01)
*H01L 51/42* (2006.01)

(52) U.S. Cl.
CPC ........ *H01L 51/0097* (2013.01); *H01L 51/442* (2013.01); *H01L 51/0047* (2013.01);
(Continued)

(58) Field of Classification Search
CPC ...... H01L 51/0096; H01L 51/52; H01L 51/56
See application file for complete search history.

(56) References Cited

U.S. PATENT DOCUMENTS 7,063,994 B2 *  6/2006  Xiao ............... B82Y 10/00
                                           438/22
7,834,528 B2 * 11/2010  Numajiri ......... B32B 7/02
                                           313/116

(Continued)

FOREIGN PATENT DOCUMENTS

JP     2006-147280 A     6/2006
JP     2008-115055 A     5/2008
(Continued)

OTHER PUBLICATIONS

International Search Report dated Jul. 11, 2013 of PCT/KR2013/003008 which is the parent application and its English translation—4 pages.

*Primary Examiner* — Yu-Hsi D Sun
(74) *Attorney, Agent, or Firm* — Knobbe Martens Olson & Bear LLP

(57) ABSTRACT

Provided are an integrated conductive substrate simultaneously serving as a substrate and an electrode, and an electronic device using the same. The integrated conductive substrate includes a conductive layer containing iron, which has a first surface having a first root mean square roughness, and a semiconductor layer containing a semiconductor material, which has a second surface having a second root mean square roughness and is formed on the first surface. Here, the semiconductor layer includes a semiconductor-type planarization layer formed by a solution process using at least
(Continued)

one of the semiconductor material and a precursor of the semiconductor material to planarize the first surface of the conductive layer, and the second root mean square roughness is smaller than the first root mean square roughness.

13 Claims, 2 Drawing Sheets

(52) U.S. Cl.
CPC .......... *H01L 51/422* (2013.01); *H01L 51/424* (2013.01); *H01L 51/4226* (2013.01); *H01L 51/4233* (2013.01); *H01L 2251/305* (2013.01); *Y02E 10/549* (2013.01)

(56) References Cited

U.S. PATENT DOCUMENTS

| 9,184,419 B2* | 11/2015 | Mandlik ............. H01L 51/0097 |
| 2005/0274412 A1 | 12/2005 | Kang et al. |

FOREIGN PATENT DOCUMENTS

| KR | 10-2005-0117041 A | 12/2005 |
| KR | 10-0830637 B1 | 5/2008 |
| KR | 10-2008-0052082 A | 6/2008 |

* cited by examiner

INTEGRATED CONDUCTIVE SUBSTRATE, AND ELECTRONIC DEVICE EMPLOYING SAME

TECHNICAL FIELD

The present invention relates to an integrated conductive substrate and an electronic device using the same.

BACKGROUND ART

At this stage of increasing attention to new regeneration energy around the world, an organic photovoltaic cells (OPVs) having potential as future energy and various advantages are receiving attention. The OPVs can be manufactured in a thin film and at a low price, compared to inorganic photovoltaic cells using silicon, and may be applied to future various flexible devices in various ways.

A conventional OPV may include an anode, a hole extraction layer, a light active layer, and a cathode. The light irradiated to the OPVs may be separated into electrons and holes in the light active layer. The holes may be extracted through the anode via the hole extraction layer, and the electrons may be extracted through the cathode.

To solve issues of high efficiency, a long life span, and a simple device structure, researches on inverted OPVs using metal oxides such as $TiO_2$, $ZrO_2$, and ZnO are on the rise as the most representative solutions which are stable in the air and can be applied to an R2R process.

In the inverted device, in contrast with a general OPV device structure in which holes are extracted through a transparent electrode such as an indium tin oxide (ITO), electrons are extracted through the transparent electrode (e.g., ITO or FTO) to serve as a cathode, and anodes generally use a metal such as Au or Ag.

Due to such a structure, the inverted device may not use a highly-reactive electron extraction electrode (that is, a cathode) used in the general OPV device, a metal such as Ca, Ba, or Li, but may use materials having no reactivity to air or moisture because both of the anode and cathode have high work functions. Although organic materials may be used as an electron extraction layer of an inverted OPV device, particularly, since a metal oxide has high transparency in a visible region and high charge transport capability, and is stable in the air, there are various researches for applying such a metal oxide formed in a solution process to the inverted device.

However, when a conventional oxide electrode such as ITO or FTO, which is disposed on a glass substrate, is bent so as to have a crack in a thin film, it cannot serve as an electrode any more. In addition, although the conventional glass substrate is used since a substrate should also stand a process of depositing a metal oxide performed in a high temperature process at 200° C. or more, the glass substrate is not flexible. Accordingly, it is necessary to use a substrate and an electrode, which has excellent mechanical strength to be bendable and can endure in a high temperature process of 200° C. or more. As such a substrate, a metal foil may be used, but the prior art disclosed that when the metal foil is used, a device is realized by further depositing an electrode after forming an insulating planarization layer, or a device having a complicated structure is realized by further depositing a metal serving as a planarization layer and a reflective conductive layer on the metal foil.

DISCLOSURE

Technical Problem

The present invention is directed to providing an electronic device using an integrated conductive substrate simultaneously serving as a substrate and an electrode.

Technical Solution

One aspect of the present invention provides an integrated conductive substrate simultaneously serving as a substrate and an electrode, which includes a conductive layer containing iron, which has a first surface having a first root mean square roughness (Rq), and a semiconductor layer containing a semiconductor material, which is formed on the first surface and has a second surface having a second root mean square roughness (Rq). The semiconductor layer includes a semiconductor-type planarization layer formed by a solution process using at least one of the semiconductor material and a precursor of the semiconductor material to planarize the first surface of the conductive layer, and the second root mean square roughness (Rq) is smaller than the first root mean square roughness (Rq).

The first root mean square roughness (Rq) of the integrated conductive substrate may be 10 nm or more, and the second root mean square roughness (Rq) may be less than 10 nm.

The conductive layer may include at least one material selected from steel, carbon steel, special steel, stainless steel, cast iron, and steel casting.

The semiconductor material included in the semiconductor layer may include at least one selected from $TiO_x$ (x is a real number of 1 to 3), indium oxide ($In_2O_3$), tin oxide ($SnO_2$), zinc oxide (ZnO), zinc tin oxide, gallium oxide ($Ga_2O_3$), tungsten oxide ($WO_3$), aluminum oxide, titanium oxide, vanadium oxide ($V_2O_5$, $VO_2$, $V_4O_7$, $V_5O_9$, or $V_2O_3$), molybdenum oxide ($MoO_3$ or $MoO_x$), copper (II) oxide (CuO), nickel oxide (NiO), copper aluminum oxide (CAO; $CuAlO_2$), zinc rhodium oxide (ZRO; $ZnRh_2O_4$), iron oxide, chromium oxide, bismuth oxide, indium-gallium zinc oxide (IGZO), and $ZrO_2$.

Another aspect of the present invention provides a method of manufacturing an integrated conductive substrate, which includes preparing a conductive layer containing iron, which has a first surface having a first root mean square roughness (Rq), and forming a semiconductor layer containing a semiconductor material, which is formed on the first surface of the conductive layer and has a second surface having a second root mean square roughness (Rq). Here, the forming of the semiconductor layer includes a process of forming a semiconductor-type planarization layer by providing a first mixture including at least one of the semiconductor material and a precursor of the semiconductor material and a solvent, removing the solvent, and planarizing the first surface of the conductive layer, and the second root mean square roughness (Rq) is smaller than the first root mean square roughness (Rq).

Still another aspect of the present invention provides an electronic device using the integrated conductive substrate.

The integrated conductive substrate of the electronic device may simultaneously serve as i) a substrate and a cathode, or ii) a substrate and an anode.

In the electronic device, a bottom surface of the conductive layer of the integrated conductive substrate may be in contact with external air.

In the electronic device, a pixel defining film may be patterned on a semiconductor layer of the integrated conductive substrate.

The electronic device may be a flexible inverted OPV which includes the integrated conductive substrate, a transparent anode facing the semiconductor layer of the integrated conductive substrate, and a light active layer interposed between the semiconductor layer of the integrated conductive substrate and the transparent anode, and the integrated conductive substrate may simultaneously serve as a substrate and a cathode.

Advantageous Effects

Since an integrated conductive substrate simultaneously serving as a substrate and an electrode has excellent mechanical strength, surface planarization, and conductivity, it can be usefully applied to an electronic device (e.g., an OPV) stable in the air. In addition, the integrated conductive substrate has flexibility and can be manufactured on a large scale at a low price.

MODES OF INVENTION

Hereinafter, exemplary embodiments of the present invention will be described in detail with reference to the accompanying drawings.

Figure 1:
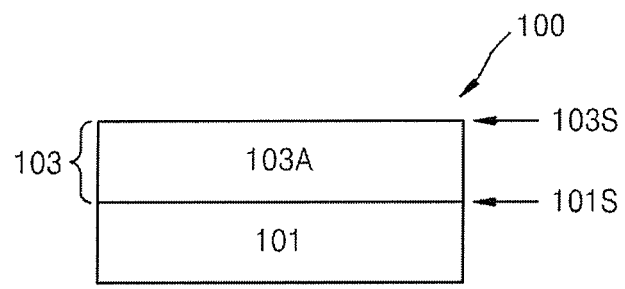
FIG. 1 is a schematic diagram of an integrated conductive substrate according to an exemplary embodiment.

FIG. 1 is a schematic diagram of a cross-section of an integrated conductive substrate 100 according to an exemplary embodiment.

The integrated conductive substrate 100 includes i) a conductive layer 101, and ii) a semiconductor layer 103 composed of a semiconductor-type planarization layer 103A in contact with a first surface 101S of the conductive layer 101. The first surface 101S of the conductive layer 101 has a first root mean square roughness (Rq), and a second surface 103S of the semiconductor layer 103 has a second root mean square roughness (Rq). The second root mean square roughness (Rq) is smaller than the first root mean square roughness (Rq).

The conductive layer 101 is a non-transparent conductive layer, and has a monolayer structure. The conductive layer 101 contains iron.

The conductive layer 101 may be a foil formed of an iron-containing conductive material. Accordingly, the integrated conductive substrate 100 may have flexibility.

The conductive layer 101 may include at least one material selected from, for example, steel, carbon steel, special steel, stainless steel, cast iron, and steel casting. The special steel may be an alloy of iron and carbide, but the present invention is not limited thereto.

For example, the conductive layer 101 may be a layer formed of one type of a conductive material, a layer formed by co-depositing at least two different conductive materials, or a layer formed of an alloy of at least two different conductive materials.

Specifically, the conductive layer 101 may be a stainless steel foil, but the present invention is not limited thereto.

The conductive layer 101 may have a thickness of 50 nm to 5 mm, for example, 10 to 500 μm. When the thickness of the conductive layer 101 satisfies the above range, the integrated conductive substrate 100 may be non-transparent and flexible.

The first root mean square roughness (Rq) of the first surface 101S of the conductive layer 101 is a root-mean-square average roughness ($R_q$, measured by an atomic force microscope (AFM)).

The "root mean square roughness" used herein refers to the Rq value measured by the AFM.

For example, when the conductive layer 101 is a foil formed of a conductive material, the root mean square roughness of the first surface 101S may be 10 nm or more.

Particularly, a commercially-available stainless steel foil may have a root mean square roughness of 100 nm or more. As a mechanical polishing, chemical mechanical polishing, or electro-polishing process is performed to a surface of the commercially-available stainless steel foil once or twice, the root mean square roughness of the stainless steel foil may be 10 to 100 nm.

To make the first root mean square roughness of the first surface 101S of the conductive layer 101 less than 10 nm, conventionally at least three times-performed polishing processes are needed, and such three times or more-performed polishing are high cost processes. Here, to reduce a cost, when an organic layer (for example, an electron-extraction interfacial layer, a light active layer, or a hole extraction layer, etc.) of the OPV is directly formed on the conductive layer 101 having the first surface 101S having the first root mean square roughness of 10 nm or more, the OPV has an electrical short, and thus electrical characteristics of the OPV may be drastically degraded.

To solve the above-described problems, the inventor invented the semiconductor-type polarization layer 103A to reduce a high first root mean square roughness of the first surface 101S of the conductive layer 101, to be formed by a low cost process, and to apply a substrate to a device.

The semiconductor-type planarization layer 103A may be formed by a solution process using at least one of a semiconductor material and a precursor of the semiconductor material to planarize the first surface 101S of the conductive layer 101.

The "solution process" used herein means a process of forming a predetermined film by removing flowability of a mixture through a room temperature exposure process or a thermal treatment process at a temperature of room temperature or more after the mixture having flowability is provided on a predetermined substrate.

Since the semiconductor-type planarization layer 103A is formed by the solution process, a morphology of the second surface 103S of the semiconductor-type planarization layer 103A, that is, the semiconductor layer 103, does not follow a morphology of the first surface 101S of the conductive layer 101. Accordingly, the second root mean square roughness of the second surface 103S of the semiconductor-type planarization layer 103A, that is, the semiconductor layer 103, is smaller than the first root mean square roughness of the first surface 101S of the conductive layer 101.

For example, the second root mean square roughness of the second surface 103S of the semiconductor layer 103 may be approximately 50% or less of the first root mean square roughness of the first surface 101S of the conductive layer 101.

Particularly, the second root mean square roughness of the second surface 103S of the semiconductor-type polarization layer 103A, that is, the semiconductor layer 103 may be less than 10 nm.

Accordingly, although the organic layer (for example, an electron-extraction interfacial layer, a light active layer, or a hole extraction layer) of the OPV is directly formed on the second surface 103S of the semiconductor-type planarization layer 103A, that is, the semiconductor layer 103, an electrical failure such as an electrical short does not occur, and thus a high quality electronic device (for example, an OPV) may be realized. In addition, since the semiconductor-type planarization layer 103A is formed by a solution process advantageous for production on a large scale at a low price, a production cost of the OPV may be reduced by using the integrated conductive substrate 100 of FIG. 1.

The semiconductor material included in the semiconductor-type planarization layer 103A may include at least one selected from $TiO_x$ (x is a real number of 1 to 3), indium oxide ($In_2O_3$), tin oxide ($SnO_2$), zinc oxide (ZnO), zinc tin oxide, gallium oxide ($Ga_2O_3$), tungsten oxide ($WO_3$), aluminum oxide, titanium oxide, vanadium oxide ($V_2O_5$, $VO_2$, $V_4O_7$, $V_5O_9$, or $V_2O_3$), molybdenum oxide ($MoO_3$ or $MoO_x$), copper (II) Oxide (CuO), nickel oxide (NiO), copper aluminum oxide (CAO; $CuAlO_2$), zinc rhodium oxide (ZRO; $ZnRh_2O_4$), iron oxide, chromium oxide, bismuth oxide, indium-gallium zinc oxide (IGZO), and $ZrO_2$, but the present invention is not limited thereto.

The semiconductor material may be selected from materials having no reactivity to air or moisture such as semiconductor materials having excellent transparency in a visible region.

The semiconductor material may be $TiO_x$ (x is a real number of 1 to 3), indium oxide ($In_2O_3$), tin oxide ($SnO_2$), zinc oxide (ZnO), zinc tin oxide, gallium oxide ($Ga_2O_3$), tungsten oxide ($WO_3$), aluminum oxide, titanium oxide, vanadium oxide ($V_2O_5$, $VO_2$, $V_4O_7$, $V_5O_9$, or $V_2O_3$), molybdenum oxide ($MoO_3$ or $MoO_x$), iron oxide, chromium oxide, bismuth oxide, indium-gallium zinc oxide (IGZO), or $ZrO_2$, and the material has an N-type semiconductor characteristic, resulting in an excellent electron extraction capability. Accordingly, the integrated conductive substrate 100 may have an excellent electron extraction characteristic.

In another example, the semiconductor material may be nickel oxide (NiO), copper (II) oxide (CuO), copper aluminum oxide (CAO; $CuAlO_2$), or zinc rhodium oxide (ZRO; $ZnRh_2O_4$), and the material has a P-type semiconductor characteristic, resulting in an excellent hole extraction capability.

Accordingly, the integrated conductive substrate 100 may have an excellent hole extraction characteristic. In addition, since an N-type semiconductor such as tin oxide ($SnO_2$), zinc oxide (ZnO), zinc tin oxide, tungsten oxide ($WO_3$), vanadium oxide ($V_2O_5$, $VO_2$, $V_4O_7$, $V_5O_9$, or $V_2O_3$), or molybdenum oxide ($MoO_3$ or $MoO_x$) has a high work-function, the integrated conductive substrate 100 using the same can be used as a hole extraction electrode.

The semiconductor layer 103 may have a thickness of 5 to 300 nm, for example, 20 to 100 nm, but the present invention is not limited thereto. As the thickness of the semiconductor layer 103 satisfies the above range, a surface of the first surface 101S of the conductive layer 101 may be effectively planarized to maintain flexibility of the integrated conductive substrate 100.

The integrated conductive substrate 100 simultaneously serves as a substrate and an electrode. Accordingly, when the integrated conductive substrate 100 is used as a substrate and electrode of the OPV, the organic layer (for example, an electron-extraction interfacial layer, a light active layer, or a hole extraction layer) of the OPV may be directly formed on the semiconductor layer 103 of the integrated conductive substrate 100.

Meanwhile, when the integrated conductive substrate 100 is employed in an electronic device, a bottom surface of the conductive layer 101, that is, an opposite surface of the first surface 101S of the conductive layer 101, of the integrated conductive substrate 100 is in contact with external air.

Accordingly, the integrated conductive substrate 100 is different from a metal layer and a conductive oxide which are formed on a glass substrate to serve only as an electrode, not to serve as a substrate, and a multilayer structure in which a metal foil is used as a substrate, an insulating planarization layer (or an insulating buffer layer) is formed on the metal foil, and an electrode is formed on the insulating planarization layer.

An exemplary embodiment of a method of manufacturing the integrated conductive substrate 100 is as follows:

First, a conductive layer 101 is prepared. As the conductive layer 101, a commercially available stainless steel foil whose surface is treated by a polishing process (for example, a polishing process performed once or twice) requiring a minimum cost may be used.

Subsequently, a semiconductor-type planarization layer 103A, that is, a semiconductor layer 103, is formed on a first surface 101S of the conductive layer 101 by providing a first mixture including at least one of a semiconductor material and a precursor of the semiconductor material and a solvent and removing the solvent so as to planarize the first surface 101S of the conductive layer 101.

An example of the semiconductor material is referred to as described above.

When the first mixture includes a semiconductor material, for example, a nano particle of the semiconductor material may be included. The nano particle may have an average particle size of 1 to 100 nm.

When the first mixture includes a precursor of the semiconductor material, the precursor of the semiconductor material may be selected from optional materials that can be converted into a semiconductor material in a process of removing a solvent from the first mixture (for example, a thermal treatment process).

For example, the precursor of the semiconductor material may be a sol-gel precursor.

When the first mixture includes a sol-gel precursor of a semiconductor material and the semiconductor material is a metal oxide, the sol-gel precursor may be selected from the metal oxide and a salt including a metal of the metal oxide (for example, a metal halide, a metal sulfate, or a metal perchlorate).

For example, when the semiconductor-type planarization layer 103A includes ZnO, the first mixture may include, but is not limited to, at least one selected from zinc oxide, zinc sulfate, zinc fluoride, zinc chloride, zinc bromide, zinc iodide, zinc perchlorate, zinc hydroxide ($Zn(OH)_2$), zinc acetate ($Zn(CH_3COO)_2$), zinc acetate hydrate ($Zn(CH_3COO)_2 \cdot nH_2O$), diethyl zinc ($Zn(CH_3CH_2)_2$), zinc nitrate ($Zn(NO_3)_2$), zinc nitrate hydrate ($Zn(NO_3)_2 \cdot nH_2O$), zinc carbonate ($Zn(CO_3)$), zinc acetylacetonate ($Zn(CH_3COCHCOCH_3)_2$), and zinc acetylacetonate hydrate ($Zn(CH_3COCHCOCH_3)_2 \cdot nH_2O$) as a ZnO precursor.

As another example, when the semiconductor-type planarization layer 103A includes indium oxide, the first mixture may include, but is not limited to, at least one of zinc nitrate hydrate ($In(NO_3)_3 \cdot nH_2O$), indium acetate ($In(CH_3COO)_2$), indium acetate hydrate ($In(CH_3(COO)_2 \cdot nH_2O$), indium chloride (InCl, $InCl_2$, $InCl_3$), indium nitrate ($In(NO_3)_3$), indium nitrate hydrate ($In(NO_3)_3 \cdot nH_2O$), indium acetylacetonate ($In(CH_3COCHCOCH_3)_2$), and indium acetylacetonate hydrate ($In(CH_3COCHCOCH_3)_2 \cdot nH_2O$) as an indium oxide precursor.

In still another example, when the semiconductor-type planarization layer 103A includes tin oxide, the first mixture may include, but is not limited to, at least one selected from tin acetate ($Sn(CH_3COO)_2$), tin acetate hydrate ($Sn(CH_3(COO)_2 \cdot nH_2O$), tin chloride ($SnCl_2$, $SnCl_4$), tin chloride hydrate ($SnCl_n \cdot nH_2O$), tin acetylacetonate ($Sn(CH_3COCHCOCH_3)_2$), and tin acetylacetonate hydrate ($Sn(CH_3COCHCOCH_3)_2 \cdot nH_2O$) as a tin oxide precursor.

In yet another example, when the semiconductor-type planarization layer 103A includes gallium oxide, the first mixture may include, but is not limited to, at least one selected from gallium nitrate ($Ga(NO_3)_3$), gallium nitrate hydrate ($Ga(NO_3)_3 \cdot nH_2O$), gallium acetylacetonate ($Ga(CH_3COCHCOCH_3)_3$), gallium acetylacetonate hydrate ($Ga(CH_3COCHCOCH_3)_3 \cdot nH_2O$), and gallium chloride ($Ga_2Cl_4$, $GaCl_3$) as a gallium oxide precursor.

In yet another example, when the semiconductor-type planarization layer 103A includes tungsten oxide, the first mixture may include, but is not limited to, at least one selected from tungsten carbide (WC), tungstic acid powder ($H_2WO_4$), tungsten chloride ($WCl_4$ or $WCl_6$), tungsten isopropoxide ($W(OCH(CH_3)_2)_6$), sodium tungstate ($Na_2WO_4$), sodium tungsten hydrate ($Na_2WO_4 \cdot nH_2O$), ammonium tungstate (($NH_4)_6H_2W_{12}O_{40}$), ammonium tungstate hydrate (($NH_4)_6H_2W_{12}O_{40} \cdot nH_2O$), and tungsten ethoxide ($W(OC_2H_5)_6$) as a tungsten oxide precursor.

In yet another example, when the semiconductor-type planarization layer 103A includes aluminum oxide, the first mixture may include, but is not limited to, at least one selected from aluminum chloride ($AlCl_3$), aluminum nitrate ($Al(NO_3)_3$), aluminum nitrate hydrate ($Al(NO_3)_3 \cdot nH_2O$), and aluminum butoxide ($Al(C_2H_5CH(CH_3)O)$) as an aluminum oxide precursor.

In yet another example, when the semiconductor-type planarization layer 103A includes titanium oxide, the first mixture may include, but is not limited to, at least one selected from titanium isopropoxide ($Ti(OCH(CH_3)_2)_4$), titanium chloride ($TiCl_4$), titanium ethoxide ($Ti(OC_2H_5)_4$), and titanium butoxide ($Ti(OC_4H_9)_4$) as a titanium oxide precursor.

In yet another example, when the semiconductor-type planarization layer 103A includes vanadium oxide, the first mixture may include, but is not limited to, at least one selected from vanadium isopropoxide ($VO(OC_3H_7)_3$), ammonium vanadate ($NH_4VO_3$), vanadium acetylacetonate ($V(CH_3COCHCOCH_3)_3$), and vanadium acetylacetonate hydrate ($V(CH_3COCHCOCH_3)_3 \cdot nH_2O$) as a vanadium oxide precursor.

In yet another example, when the semiconductor-type planarization layer 103A includes molybdenum oxide, the first mixture may include, but is not limited to, at least one selected from molybdenum isopropoxide ($Mo(OC_3H_7)_5$), molybdenum chloride isopropoxide ($MoCl_3(OC_3H_7)_2$), ammonium molybdate (($NH_4)_2MoO_4$), and ammonium molybdate hydrate (($NH_4)_2MoO_4 \cdot nH_2O$) as a molybdenum oxide precursor.

In yet another example, when the semiconductor-type planarization layer 103A includes copper oxide, the first mixture may include, but is not limited to, at least one selected from copper chloride (CuCl, $CuCl_2$), copper chloride hydrate ($CuCl_2 \cdot nH_2O$), copper acetate ($Cu(CO_2CH_3)$, $Cu(CO_2CH_3)_2$), copper acetate hydrate ($Cu(CO_2CH_3)_2 \cdot nH_2O$), copper acetylacetonate ($Cu(C_5H_7O_2)_2$), copper nitrate ($Cu(NO_3)_2$), copper nitrate hydrate ($Cu(NO_3)_2 \cdot nH_2O$), copper bromide (CuBr, $CuBr_2$), copper carbonate ($CuCO_3 \cdot Cu(OH)_2$), copper sulfate ($Cu_2S$ or CuS), copper phthalocyanine ($C_{32}H_{16}N_8Cu$), copper trifluoroacetate ($Cu(CO_2CF_3)_2$), copper isobutyrate ($C_8H_{14}CuO_4$), copper ethylacetoacetate ($C_{12}H_{18}CuO_6$), copper(II)-ethylhexanoate ($[CH_3(CH_2)_3CH(C_2H_5)CO_2]_2Cu$), copper fluoride ($CuF_2$), copper formate hydrate (($HCO_2)_2Cu \cdot nH_2O$), copper gluconate ($C_{12}H_{22}CuO_{14}$), copper hexafluoroacetylacetonate ($Cu(C_5HF_6O_2)_2$), copper hexafluoroacetylacetonate hydrate ($Cu(C_5HF_6O_2)_2 \cdot 6H_2O$), copper methoxide ($Cu(OCH_3)_2$), copper neodecanoate ($C_{10}H_{19}O_2Cu$), copper perchlorate hydrate ($Cu(ClO_4)_2 \cdot 6H_2O$), copper sulfate ($CuSO_4$), copper sulfate hydrate ($CuSO_4 \cdot nH_2O$), copper tartrate hydrate ($[^-CH(OH)CO_2]_2Cu \cdot nH_2O$), copper trifluoroacetylacetonate ($Cu(C_5H_4F_3O_2)_2$), copper trifluoromethanesulfonate (($CF_3SO_3)_2Cu$), and tetraamine copper sulfate hydrate ($Cu(NH_3)_4SO_4 \cdot H_2O$) as a copper oxide precursor.

In yet another example, when the semiconductor-type planarization layer 103A includes nickel oxide, the first mixture may include, but is not limited to, at least one selected from nickel chloride ($NiCl_2$), nickel chloride hydrate ($NiCl_2 \cdot nH_2O$), nickel acetate hydrate ($Ni(OCOCH_3)_2 \cdot 4H_2O$), nickel nitrate hydrate ($Ni(NO_3)_2 \cdot 6H_2O$), nickel acetylacetonate ($Ni(C_5H_7O_2)_2$), nickel hydroxide ($Ni(OH)_2$), nickel phthalocyanine ($C_{32}H_{16}N_8Ni$), and nickel carbonate hydrate ($NiCO_3 \cdot 2Ni(OH)_2 \cdot nH_2O$) as a nickel oxide precursor.

In yet another example, when the semiconductor-type planarization layer 103A includes iron oxide, the first mixture may include, but is not limited to, at least one selected from iron acetate ($Fe(CO_2CH_3)_2$), iron chloride ($FeCl_2$ or $FeCl_3$), iron chloride hydrate ($FeCl_3 \cdot nH_2O$), iron acetylacetonate ($Fe(C_5H_7O_2)_3$), iron nitrate hydrate ($Fe(NO_3)_3 \cdot 9H_2O$), iron phthalocyanine ($C_{32}H_{16}FeN_8$), and iron oxalate hydrate ($Fe(C_2O_4) \cdot nH_2O$ or $Fe_2(C_2O_4)_3 \cdot 6H_2O$) as an iron oxide precursor.

In yet another example, when the semiconductor-type planarization layer 103A includes chromium oxide, the first mixture may include, but is not limited to, at least one selected from chromium chloride ($CrCl_2$ or $CrCl_3$), chromium chloride hydrate ($CrCl_3 \cdot nH_2O$), chromium carbide ($Cr_3C_2$), chromium acetylacetonate ($Cr(C_5H_7O_2)_3$), chromium nitrate hydrate ($Cr(NO_3)_3 \cdot nH_2O$), chromium hydroxide acetate (($CH_3CO_2)_7Cr_3(OH)_2$), and chromium acetate hydrate ($[(CH_3CO_2)_2Cr \cdot H_2O]_2$) as a chromium oxide precursor.

In yet another example, when the semiconductor-type planarization layer 103A includes bismuth oxide, the first mixture may include, but is not limited to, at least one selected from bismuth chloride ($BiCl_3$), bismuth nitrate hydrate ($Bi(NO_3)_3 \cdot nH_2O$), bismuth acetate (($CH_3CO_2)_3Bi$), and bismuth carbonate (($BiO)_2CO_3$) as a bismuth oxide precursor.

The solvent in the first mixture may be selected from optional solvents which have miscibility with a semiconductor material and/or a precursor of the semiconductor material, and is easily removed by a thermal treatment process.

As the solvent of the first mixture, both of a polar solvent and a non-polar solvent may be used. For example, as the polar solvent, an alcohol or a ketone may be used, and as the non-polar solvent, an aromatic hydrocarbon-, alicyclic hydrocarbon-, or aliphatic hydrocarbon-based organic solvent may be used. The solvent of the first mixture may be, but is not limited to, at least one selected from ethanol, dimethylformamide, ethanol, methanol, propanol, butanol, isopropanol, methylethylketone, propyleneglycol (mono)methylether (PGM), isopropylcellulose (IPC), methylcellosolve (MC), ethylene carbonate (EC), methylcellosolve, ethylcellosolve, 2-methoxy ethanol, and ethanol amine.

For example, when a semiconductor-type planarization layer 103A formed of ZnO is formed, the first mixture provided to the first surface 101S of the conductive layer 101 may include zinc acetate dehydrate as a precursor of a semiconductor material, and a combination of 2-methoxy ethanol and ethanol amine as a solvent, but the present invention is not limited thereto.

A method of providing the first mixture on the first surface 101S of the conductive layer 101 may be selected from known coating methods, for example, a spin coating method, a casting method, a Langmuir-Blodgett (LB) method, a spray coating method, a dip coating, method, a gravure coating method, a reverse off-set coating method, a screen printing method, a slot-die coating method, a nozzle printing method, and a dry transfer printing method, but the present invention is not limited thereto.

To remove the solvent from the first mixture provided on the first surface 101S of the conductive layer 101, a thermal treatment process may be used, and the thermal treatment condition may vary according to the type and content of the selected solvent, but may be selected at 100 to 350° C. for 0.1 to 1 hour.

Figure 2:
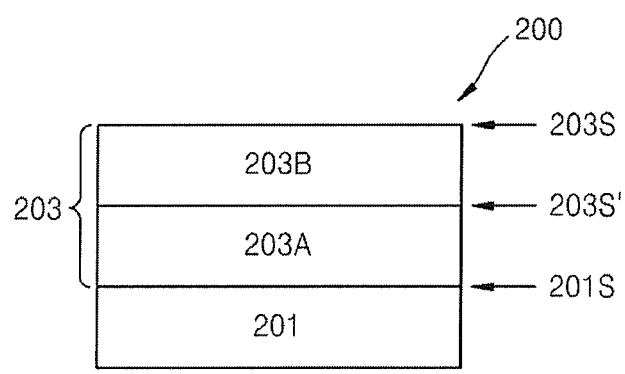
FIG. 2 is a schematic diagram of an integrated conductive substrate according to another exemplary embodiment.

FIG. 2 is a schematic diagram of a cross-section of an integrated conductive substrate 200 according to another exemplary embodiment.

The integrated conductive substrate 200 of FIG. 2 includes a conductive layer 201 and a semiconductor layer 203, and the semiconductor layer 203 includes a semiconductor-type planarization layer 203A formed by a solution process and an intermediate layer 203B formed by a deposition method. The semiconductor-type planarization layer 203A is in contact with a first surface 201S of the conductive layer 201, and the intermediate layer 203B is formed on the semiconductor-type planarization layer 203A.

Descriptions for the conductive layer 201 of FIG. 2 refers to the descriptions for the conductive layer 101 of FIG. 1. The first surface 201S of the conductive layer 201 of FIG. 2 may have a first root mean square roughness (Rq) of 10 nm or more, like the first root mean square roughness (Rq) of the first surface 101S of the conductive layer 101 of FIG. 1.

Descriptions for the semiconductor-type planarization layer 203A of FIG. 2 refers to the descriptions for the semiconductor-type planarization layer 103A of FIG. 1. The semiconductor-type planarization layer 203A is formed by a solution process, and therefore a morphology of a surface 203S' of the semiconductor-type planarization layer 203A does not follow a morphology of the first surface 201S of the conductive layer 201. Accordingly, the surface 203S' of the semiconductor-type planarization layer 203A may have a root mean square roughness (Rq) lower than the first surface 201S of the conductive layer 201. For example, the root mean square roughness (Rq) of the surface 203S' of the semiconductor-type planarization layer 203A may be less than 10 nm.

The intermediate layer 203B is formed on the semiconductor-type planarization layer 203A by a deposition method. The intermediate layer 203B may serve to increase conductivity and a charge extraction characteristic of the integrated conductive substrate 200 of FIG. 2.

Conditions for forming the intermediate layer 203B may vary according to a compound to be deposited, but may be selected, for example, in ranges of a deposition temperature of 25 to 1500° C., a vacuum degree of $10^{-10}$ to $10^{-3}$ torr, and a deposition speed of 0.01 to 100 Å/sec.

A thickness of the intermediate layer 203B may be, but is not limited to, 5 to 200 nm, for example, 20 to 50 nm. When the thickness of the intermediate layer 203B satisfies the above range, a flexible inverted OPV which facilitates electron extraction and transport and maintains flexibility may be realized.

The intermediate layer 203B may include a semiconductor material. An exemplary example of the semiconductor material which may be included in the intermediate layer 203B refers to an exemplary example of the semiconductor material which may be included in the semiconductor-type planarization layer 103A, that is, the semiconductor layer 103 of FIG. 1.

The semiconductor material included in the semiconductor-type planarization layer 203A may be the same as or different from that included in the intermediate layer 203B. According to an exemplary embodiment, the semiconductor material included in the semiconductor-type planarization layer 203A may be the same as or different from that included in the intermediate layer 203B, but the present invention is not limited thereto.

Although the intermediate layer 203B is formed by the deposition method, since the surface 203S' of the semiconductor-type planarization layer 203A under the intermediate layer 203B has a smaller root mean square roughness (Rq) due to the reason as described above, a second root mean square roughness (Rq) of a surface of the intermediate layer 203B, that is, a second surface 203S of the semiconductor layer 203, may have a root mean square roughness (Rq) that the surface 203S' of the semiconductor-type planarization layer 203A has.

For example, the second root mean square roughness (Rq) of the second surface 203S of the semiconductor layer 203 of FIG. 2 may be less than 10 nm. Accordingly, although an organic layer (for example, an electron-extraction interfacial layer, a light active layer, or a hole extraction layer) of the OPV is directly formed on the second surface 203S of the semiconductor layer 203, an electrical failure such as an electrical short does not occur, and therefore a high quality electronic device (for example, an OPV) may be realized using the integrated conductive substrate 200.

The thickness range of the semiconductor layer 203 of FIG. 2 refers to a thickness range of the semiconductor layer 103 of FIG. 1.

Figure 3:
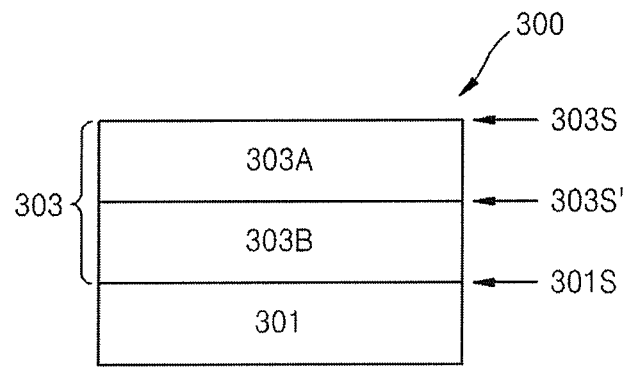
FIG. 3 is a schematic diagram of an integrated conductive substrate according to still another exemplary embodiment.

FIG. 3 is a schematic diagram of a cross-section of an integrated conductive substrate 300 according to an exemplary embodiment.

The integrated conductive substrate 300 of FIG. 3 includes a conductive layer 301 and a semiconductor layer 303, and the semiconductor layer 303 includes an intermediate layer 303B formed by a deposition method and a semiconductor-type planarization layer 303A formed by a solution process. The intermediate layer 303B is interposed between the conductive layer 301 and the semiconductor-type planarization layer 303A.

Descriptions for the conductive layer 301 of FIG. 3 refer to the descriptions for the conductive layer 101 of FIG. 1. A first root mean square roughness (Rq) of a first surface 301S of the conductive layer 301 of FIG. 3 may be 10 nm or more, like the first root mean square roughness (Rq) of the first surface 101S of the conductive layer 101 of FIG. 1.

Descriptions for the intermediate layer 303B of FIG. 3 refer to the descriptions for the intermediate layer 203B of FIG. 2. However, since a morphology of a surface 303S' of the intermediate layer 303B of FIG. 3 follows a morphology of the first surface 301S of the underlying conductive layer 301, unlike the surface 203S of the intermediate layer 203B of FIG. 2, a root mean square roughness (Rq) of the surface 303S' of the intermediate layer 303B may be 10 nm or more.

Descriptions for the semiconductor-type planarization layer 303A of FIG. 3 refers to the descriptions for the semiconductor-type planarization layer 103A of FIG. 1. Since the semiconductor-type planarization layer 303A is formed by a solution process, a morphology of a second surface 303S of the semiconductor-type planarization layer 303A does not follow the morphology of the surface 303S' of the intermediate layer 303B. Accordingly, a second root mean square roughness (Rq) of a surface of the semiconductor-type planarization layer 303A, that is, the second surface 303S of the semiconductor layer 303, is smaller than the first root mean square roughness (Rq) of the first surface 301S of the conductive layer 301. For example, a root mean square roughness (Rq) of the surface of the semiconductor-type planarization layer 303A, that is, the second surface 303S of the semiconductor layer 303, may be less than 10 nm.

Accordingly, although an organic layer (for example, an electron-extraction interfacial layer, a light active layer, or a hole extraction layer) of the OPV is directly formed on the second surface 303S of the semiconductor layer 303, an electrical failure such as an electrical short does not occur, and therefore a high quality electronic device (for example, an OPV) may be realized using the integrated conductive substrate 300.

As a result, an electronic device using the above-described integrated conductive substrate 100, 200, or 300 is provided.

The electronic device may be an OPV.

The organic layer of the OPV may be formed on the second surface 103S, 203S, or 303S of the semiconductor layer 103, 203, or 303 of the integrated conductive substrate 100, 200, or 300, and a bottom surface of the conductive layer 101, 201, or 301 of the integrated conductive substrate 100, 200, or 300 may be in contact with external air. Consequently, it is clear that the integrated conductive substrate 100, 200, or 300 simultaneously serves as an electrode and a substrate.

A pixel defining film may be patterned on the second surface 103S, 203S, or 303S of the semiconductor layer 103, 203, or 303 of the integrated conductive substrate 100, 200, or 300.

The pixel defining film may serve to define an actual pixel or a pixel region. In addition, to drive the device after forming a counter electrode of the integrated conductive substrate 100, 200, or 300, an electrode for an electrical interconnection may be further formed in a region other than the pixel, and the pixel defining film provides a position at which the electrode for an electrical interconnection is formed. When an insulating pixel defining film is not formed between the integrated conductive substrate 100, 200, or 300 and the counter electrode, during supply of charges through the integrated conductive substrate 100, 200, or 300 and the counter electrode, a leakage current or an electrical short may occur due to a minute pressure of a measuring or driving probe.

The pixel defining film may be formed using an optional insulating material such as an insulating polymer or an insulating ceramic material.

As the insulating polymer material, a material including a double or triple bond and not having a p-p conjugated structure can be used. For example, at least one of polystyrene, crosslinked epoxy, crosslinked polydimethylsiloxane, polyethylene, photoresist polymer, poly(methyl meta acrylate)(PMMA), poly(4-vinyl phenol)(PVP), poly(melamine-co-formaldehyde), styrene-butadiene rubber, polyurethane, parylene, perylene, and a derivative thereof may be used.

The pixel defining film may further include an initiator, a catalyst, a crosslinking agent, and an additive, in addition to the insulating polymer, but the present invention is not limited thereto.

The pixel defining film including the insulating polymer material may have a thickness of 100 nm to 100 μm, and may be formed by a spin coating method, a casting method, a Langmuir-Blodgett (LB) method, a spray coating method, a dip coating, method, a gravure coating method, a reverse off-set coating method, a screen printing method, a slot-die coating method, a nozzle printing method, or a dry transfer printing method.

An exemplary example of the insulating ceramic material includes a material derived from an inorganic material such as SiO, $SiO_2$, SiNx, $Al_2O_3$, or $HfO_2$ or a sol-gel ceramic precursor (for example, a metal alkoxide such as tetramethoxysilane (TMOS) and/or tetraethyl-orthosilicate (TEOS)), but the present invention is not limited thereto.

The pixel defining film including the insulating ceramic material may have a thickness of 50 nm to 100 μm, and may be formed by thermal deposition, E-beam deposition, or atomic-layer deposition (ALD).

Figure 4:
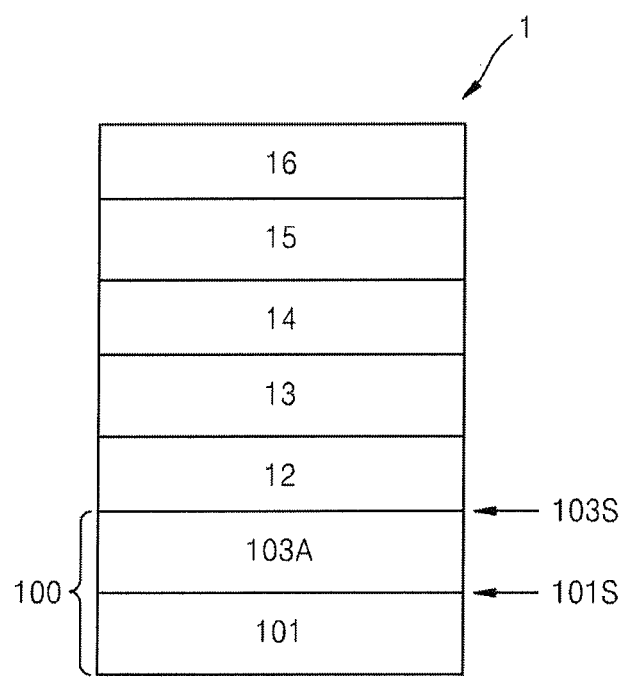
FIG. 4 is a schematic diagram of an OPV according to an exemplary embodiment.

FIG. 4 is a schematic diagram of a cross-section of a flexible inverted OPV 1 according to an exemplary embodiment.

The flexible inverted OPV 1 includes the integrated conductive substrate 100 simultaneously serving as a substrate and a cathode, a transparent anode 15 facing the integrated conductive substrate 100, and a light active layer 13 interposed between the integrated conductive substrate 100 and the transparent anode 15. An electron-extraction interfacial layer 12 is interposed between the integrated conductive substrate 100 and the light active layer 13. The electron-extraction interfacial layer 12 is in contact with the semiconductor-type planarization layer 103A of the integrated conductive substrate 100, that is, the second surface 103S of the semiconductor layer 103. A hole extraction layer 14 is interposed between the light active layer 13 and the transparent anode 15. In addition, an optical matching layer 16 is disposed on the transparent anode 15.

A bottom surface of the conductive layer 101 of the integrated conductive substrate 100 of the flexible inverted OPV 1 is in contact with external air.

Accordingly, the flexible inverted OPV 1 has a structure in which the integrated conductive substrate 100 simultaneously serving as the substrate and the cathode, the electron-extraction interfacial layer 12, the light active layer 13, the hole extraction layer 14, the transparent anode 15, and the optical matching layer 16 are sequentially stacked.

Descriptions for the integrated conductive substrate 100 refers to the descriptions for FIG. 1.

Although not shown in FIG. 1, a pixel defining film patterned by pixel may be formed on the semiconductor layer 103 of the integrated conductive substrate 100.

The electron-extraction interfacial layer 12 stimulating electron extraction in the light active layer 13 is formed on the semiconductor layer 103A of the integrated conductive substrate 100.

The electron-extraction interfacial layer 12 may include at least one of a metal carbonate, a metal azide, a metal fluoride, an ion-containing self-assembled material, and a self-assembled material not having a dipolar moment of 0.

A method of forming the electron-extraction interfacial layer 12 refers to a method of forming the semiconductor layer 103, 203, or 303 of FIGS. 1 to 3.

The metal carbonate may include at least one selected from $Li_2CO_3$, $Na_2CO_3$, $K_2CO_3$, $Rb_2CO_3$, $Cs_2CO_3$, $MgCO_3$, $CaCO_3$, and $BaCO_3$.

The metal azide may include at least one selected from $CsN_3$, $Li_3N$, and $NaN_3$.

The metal fluoride may include at least one selected from LiF, NaF, KF, $SrF_2$, CeF3, RbF, CsF, $MgF_2$, $CaF_2$, $LaF_3$, $ThF_4$, $BeF_2$, and $BaF_2$.

Examples of the ion-containing self-assembled material and the self-assembled material not having a dipolar moment of 0 may be, but are not limited to, all of materials cited in Abraham Ulman, Chem. Rev. 1996, 96, 1533-1554 including unimolecular materials (e.g. alkanethiol) ended with a —OH, —$NH_2$, —COOH (e.g., n-alkanoic acids ($C_nH_{2n+1}$COOH) or docosanoic acid (($CH_3(CH_2)_{20}$—COOH))), or —SH group, organo silicon materials such as alkylchlorosilanes, alkylalkoxysilanes, or alkylaminosilanes ended with a —$SiCl_3$ terminal end group, di-n-alkyl sulfide, di-n-alkyl disulfides, thiophenols, mercaptopyridines, mercaptoanilines, thiophenes, cysteines, xanthates, thiocarbaminates, thiocarbamates, thioureas, mercaptoimidazoles, and alkaneselenols.

The electron-extraction interfacial layer 12 may have a thickness of 1 to 10 nm, for example, 3 to 7 nm, but the present invention is not limited thereto. When the thickness of the electron-extraction interfacial layer 12 satisfies the above range, an electron extraction barrier is reduced due to change of a work-function of the semiconductor layer 103 of the integrated conductive substrate 100, and therefore the electron-hole separation in the light active layer 13 is increased. As a result, photo-conversion efficiency of the OPV 1 may be increased.

The light active layer 13 is formed on the electron-extraction interfacial layer 12.

The light active layer 13 may include a material which can separate a hole and an electron from irradiated light. For example, the light active layer 13 may include an electron donor and a hole receptor. The light active layer 13 may have various structures, such as a single layer including the electron donor and the hole receptor, or multiple layers including a layer including the electron donor and a layer including the hole receptor.

The electron donor may include a p-type conductive polymer material including π-electrons. The electron donor may be, but is not limited to, P3HT(poly(3-hexylthiophene), polysiloxane carbazole, polyaniline, polyethylene oxide, poly(l-methoxy-4-(0-disperthred1)-2,5-phenylene-vinylene, poly-[2-methoxy-5-(2'-ethylhexyloxy)-1,4-phenylene vinylene] (MEH-PPV), poly[2-methoxy-5-3(3',7'-dimethyloctyloxy)-1-4-phenylene vinylene] (MDMO-PPV), poly((2,7-(9,9-dioctyl)-fluorene)-alt-5,5-(4',7'-di-2-thienyl-2',1',3'-benzothiadiazole) (PFDTBT), poly[N',0'-heptadecanyl-2,7-carbazole-alt-5,5-(4',7'-di-2-thienyl-2',1',3-benzothiazole (PCPDTBT), polyindole, polycarbazole, polypyridiazine, polyisothianaphthalene, polyphenylene sulfide, polyvinylpyridine, polythiophene, polyfluorene, polypyridine, copper phthalocyanine (CuPc), subphthalocyanine (SubPc), chloro-aluminum phthalocyanine (ClAlPc), TAPC, or a derivative thereof. A combination (including all of a blend, a copolymer, etc.) of at least two of the examples of the electron donors may also be used.

The hole receptor may be, but is not limited to, fullerene having a high electron affinity (e.g., C60, C70, C74, C76, C78, C82, C84, C720, or C860), a fullerene derivative (e.g., [6,6]-phenyl-C61 butyric acid methyl ester (PCBM), C71-PCBM, C84-PCBM, or bis-PCBM), perylene, an inorganic semiconductor including a nano crystal such as CdS, CdTe, CdSe, or ZnO, a carbon nanotube, a carbon nanorod graphene quantum dot, a carbon quantum dot, polybenzyimidazole (PBI), 3,4,9,10 perylenetetracarboxylic bisbenzimidazole (PTCBI), or a mixture thereof.

For example, the light active layer 13 may be, but is not limited to, a monolayer including P3HT as an electron donor and PCBM, which is a fullerene derivative as a hole receptor.

Light is irradiated to the light active layer 13, and an exciton which is a pair of an electron and a hole is formed by light excitation. The exciton is separated into an electron and a hole by a difference in electron affinity between an electron donor and a hole receptor at an interface between the electron donor and the hole receptor.

The hole extraction layer 14 is formed on the light active layer 13.

The hole extraction layer 14 may include a known hole extraction material. For example, the hole extraction layer 14 may include at least one of a metal oxide and a hole extraction organic material.

When the hole extraction layer 14 includes a metal oxide, the metal oxide may include at least one metal oxide selected from $MoO_3$, $WO_3$, and $V_2O_5$. When the hole extraction layer 14 is formed of a metal oxide, a method of forming the hole extraction layer 14 refers to a method of forming a semiconductor layer 103, 203, or 303 of FIGS. 1 to 3.

When the hole extraction layer 14 includes a hole extraction organic material, the method of forming the hole extraction layer 14 may refer to a method of forming the light active layer 13.

An non-limited example of the hole extraction organic material may be, but is not limited to, fullerene ($C_{60}$), HAT-CN, $F_{16}CuP_C$, $CuP_C$, 4,4',4"-tris (3-methylphenylphenylamino) triphenylamine (m-MTDATA), N,N'-di(1-naphthyl)-N,N'-diphenylbenzidine) (NPB), TDATA, 2T-NATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), or polyaniline/poly(4-styrenesulfonate) (PANI/PSS).

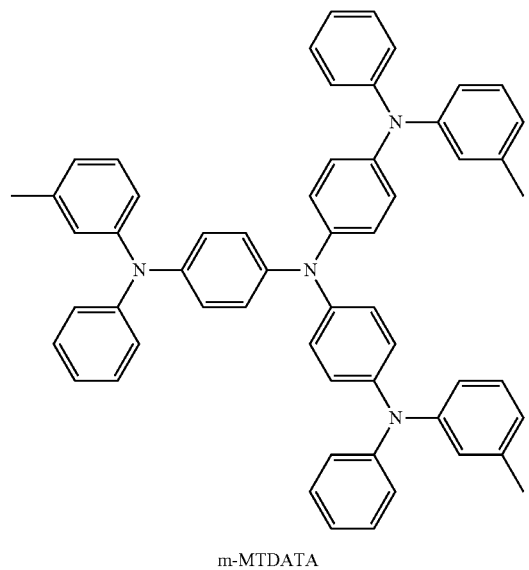

m-MTDATA

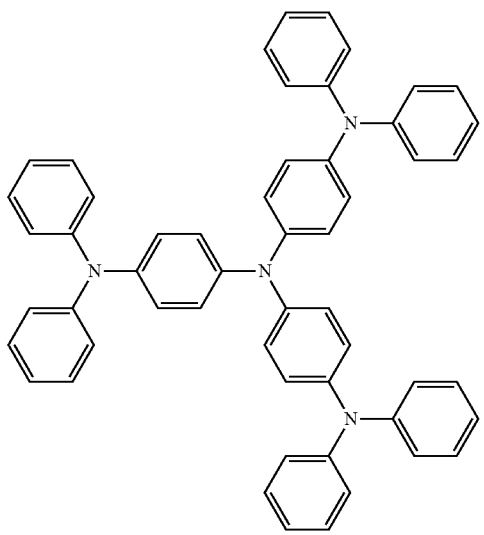

TDATA

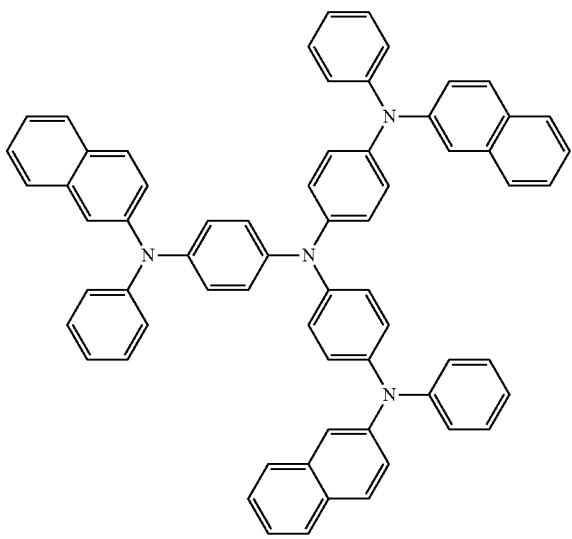

2T-DATA

For example, the hole extraction layer 14 may be a layer in which the metal oxide is doped to the hole extraction organic material matrix. Here, a doping concentration may be 0.1 to 80 wt % based on a total weight of the hole extraction layer 14.

The hole extraction layer 14 may have a thickness of 10 to 10000 Å, for example, 100 to 1000 Å. When the thickness of the hole extraction layer 14 satisfies the above range, a high quality flexible inverted OPV having flexibility may be realized.

Meanwhile, although not shown in FIG. 1, a hole transport layer may be further interposed between the light active layer 13 and the hole extraction layer 14.

The hole transport layer may include a known hole transport material. For example, a non-limited example of the hole transport material that will be included in the hole transport layer may be, but is not limited to, 1,3-bis(carbazol-9-yl)benzene (MCP), 1,3,5-tris(carbazol-9-yl)benzene (TCP), 4,4',4''-tris(carbazol-9-yl)triphenylamine (TCTA), 4,4'-bis(carbazol-9-yl)biphenyl (CBP), N,N'-bis(naphthalen-1-yl)-N,N'-bis(phenyl)-benzidine (NPB), N,N'-bis(naphthalen-2-yl)-N,N'-bis(phenyl)-benzidine (β-NPB), N,N'-bis(naphthalen-1-yl)-N,N'-bis(phenyl)-2,2'-dimethyl-benzidine (α-NPD), Di-[4-(N,N-ditolyl-amino)-phenyl]cyclohexane (TAPC), N,N,N',N'-tetra-naphthalen-2-yl-benzidine (β-TNB) and N4,N4,N4',N4'-tetra(biphenyl-4-yl)biphenyl-4,4'-diamine (TPD15), poly(9,9-dioctylfluorene-co-bis-N,N'-(4-butylphenyl)-bis-N,N'-phenyl-1,4-phenylenediamine) (PFB), poly(9,9'-dioctylfluorene-co-N-(4-butylphenyl)diphenylamine) (TFB), poly(9,9'-dioctylfluorene-co-bis-N,N'-(4-butylphenyl)-bis-N,N'-phenylbenzidine) (BFB), or poly(9,9-dioctylfluorene-co-bis-N,N'-(4-methoxyphenyl)-bis-N,N'-phenyl-1,4-phenylenediamine) (PFMO).

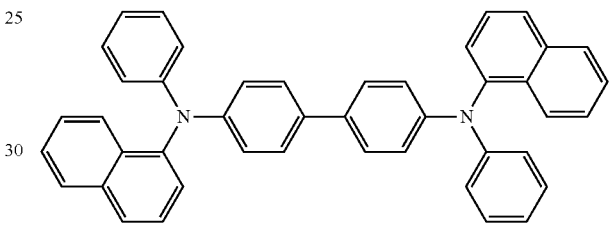

<NPB>

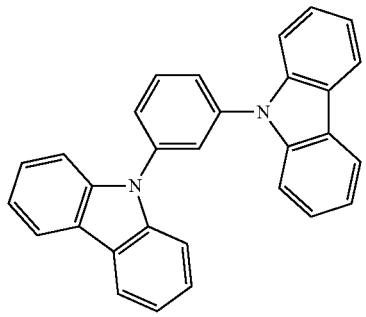

<MCP>

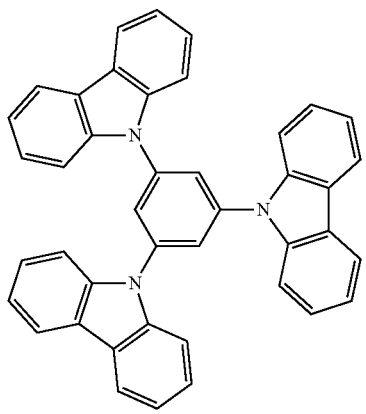

<TCP>

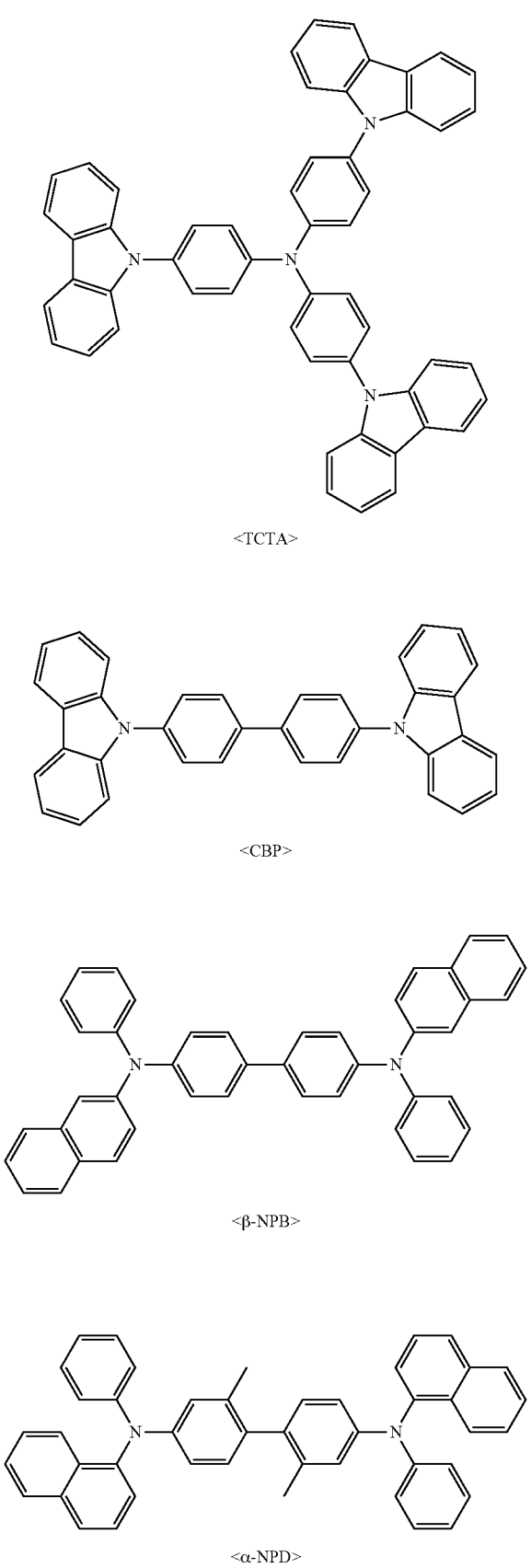

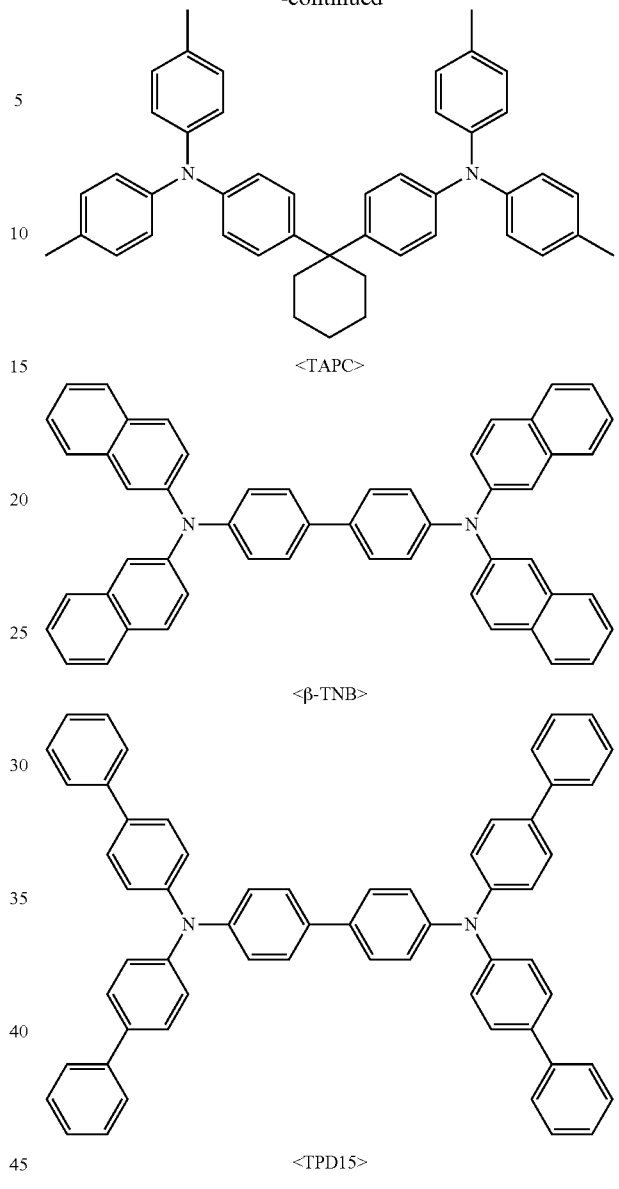

The hole transport layer may have a thickness of 5 to 100 nm, for example, 10 to 60 nm. When the thickness of the hole transport layer satisfies the above range, a high quality flexible inverted OPV having high efficiency may be realized.

The transparent anode 15 is formed on the hole extraction layer 14.

Since an exciton is formed by injection of light and a hole generated in the light active layer 13 is extracted through the transparent anode 15, the transparent anode 15 may have excellent conductivity and transmittivity.

The transparent anode 15 may include, for example, at least one of Ag, Al, Au, Mg, a Mg/Ag bilayer, a Mg/Au bilayer, a Ca/Al bilayer, a Li/Al layer, an alloy of Mg and Ag, an alloy of Mg and Al, an alloy of Mg and Au, an alloy of Ca and Al, an alloy of Li and Al, and a metal oxide (for example, $MoO_3$, $WO_3$, and $V_2O_5$).

The transparent anode 15 may have a monolayer structure which is a layer formed of at least one material, or a multilayer structure formed of at least two materials.

For example, the transparent anode 15 may have a triple-layer structure in which $MoO_3/Ag/MoO_3$ are sequentially stacked or a bilayer structure in which $Ag/MoO_3$ are sequentially stacked, but the present invention is not limited thereto.

The transparent anode 15 may have a thickness of 5 to 500 nm, for example, 10 to 60 nm. When the thickness of the transparent anode 15 satisfies the above-describe range, a hole generated in the light active layer 13 of the flexible inverted OPV 1 may be effectively extracted through the transparent anode 15.

The optical matching layer 16 is formed on the transparent anode 15.

The optical matching layer 16 may serve to enhance efficiency (that is, external efficiency) of light injected into the light active layer 13 through the transparent anode 15 according to a principle of constructive interference.

The optical matching layer 16 may include a known material, and may be, for example, an inorganic layer formed of a metal oxide selected from $MoO_3$, $WO_3$, and $V_2O_5$ or an organic layer formed of a material having a refractive index of 1.5 to 2.0, and may include, preferably, an organic material selected from $Alq_3$ and $Bebq_2$, but the present invention is not limited thereto.

Hereinafter, while the flexible inverted OPV has been described with reference to FIG. 4, it is merely an example, and therefore it should be understood by those of ordinary skill in the art that various modifications and other examples equal to the present invention can be provided.

For example, the integrated conductive substrate 100 of FIG. 4 may be replaced by the integrated conductive substrate 200 of FIG. 2 or the integrated conductive substrate 300 of FIG. 3. In addition, various modifications including that the optical matching layer 16 of the OPV 1 of FIG. 4 is omitted, a hole transport layer is interposed between the hole extraction layer 14 and the light active layer 13, the electron-extraction interfacial layer 12 is omitted, or the hole extraction layer 14 is omitted can be provided.

The electronic device is described with reference to, for example, the flexible inverted OPV of FIG. 4, but the electronic device is not limited thereto. For example, the electronic device may be transformed into a normal structure OPV in which a hole extraction layer, a light active layer, an electron transport layer, an electron-extraction interfacial layer, and a cathode are sequentially formed on the semiconductor layer 103 of the integrated conductive substrate 100. Here, the integrated conductive substrate 100 may serve as both of a substrate and an anode.

The hole extraction layer, the light active layer, the electron transport layer, and the electron-extraction interfacial layer used when the integrated conductive substrate 100 is used as an anode refer to the above-described descriptions.

The electron transport layer used when the integrated conductive substrate 100 is used as an anode may be formed on the light active layer by any one selected from various known methods such as a vacuum deposition method, a spin coating method, a nozzle printing method, a casting method, a gravure printing method, a slot die coating method, a screen printing method, and an LB method. Here, deposition conditions and coating conditions are different according to a desired compound and the structure and thermal characteristic of a desired layer, but selected within a range similar to the above-described conditions for forming a hole transport layer.

As the electron transport material, a known electron transport material may be used.

For example, the electron transport layer may include, but is not limited to, a quinoline derivative such as tris(8-hydroxyquinoline) aluminum ($Alq_3$), bis(2-methyl-8-quinolinolate)-4-(phenylphenolato)aluminum (Balq), bis(10-hydroxybenzo [h] quinolinato)-beryllium ($Bebq_2$), 2,9-dimethyl-4,7-diphenyl-1,10-phenanthroline (BCP), 4,7-diphenyl-1,10-phenanthroline (Bphen), 2,2',2"-(benzene-1,3,5-triyl)-tris(1-phenyl-1H-benzimidazole (TPBI), 3-(4-biphenyl)-4-phenyl-5-tert-butylphenyl-1,2,4-triazole (TAZ), 4-(naphthalen-1-yl)-3,5-diphenyl-4H-1,2,4-triazole (NTAZ), 2,9-bis(naphthalen-2-yl)-4,7-diphenyl-1,10-phenanthroline (NBphen), tris(2,4,6-trimethyl-3-(pyridin-3-yl)phenyl)borane (3TPYMB), phenyl-dipyrenylphosphine oxide (POPy2), 3,3',5,5'-tetra[(m-pyridyl)-phen-3-yl]biphenyl (BP4mPy), 1,3,5-tri[(3-pyridyl)-phen-3-yl]benzene (TmPyPB), 1,3-bis[3,5-di(pyridin-3-yl)phenyl]benzene (BmPyPhB), bis(10-hydroxybenzo[h]quinolinato)beryllium (Bepq2), diphenylbis(4-(pyridin-3-yl)phenyl)silane (DPPS), 1,3,5-tri(p-pyrid-3-yl-phenyl)benzene (TpPyPB), 1,3-bis[2-(2,2'-bipyridine-6-yl)-1,3,4-oxadiazo-5-yl]benzene (Bpy-OXD), or 6,6'-bis[5-(biphenyl-4-yl)-1,3,4-oxadiazo-2-yl]-2,2'-bipyridyl (BP-OXD-Bpy).

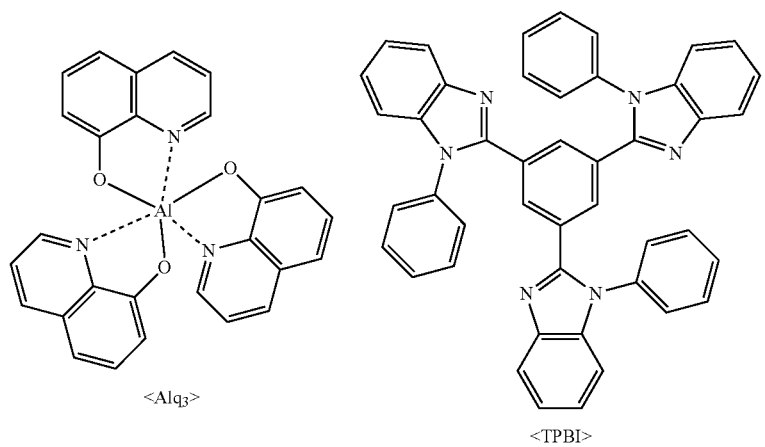

<$Alq_3$>     <TPBI>

-continued
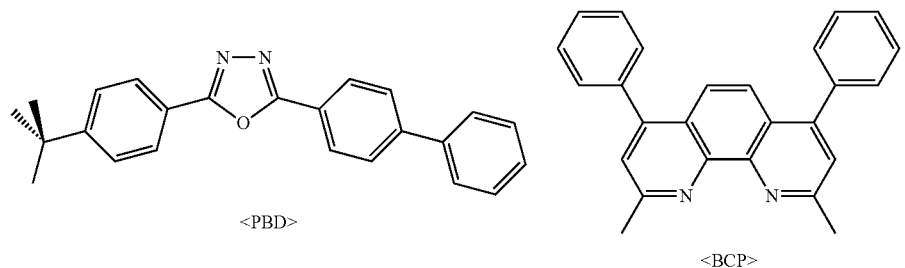
<PBD>    <BCP>
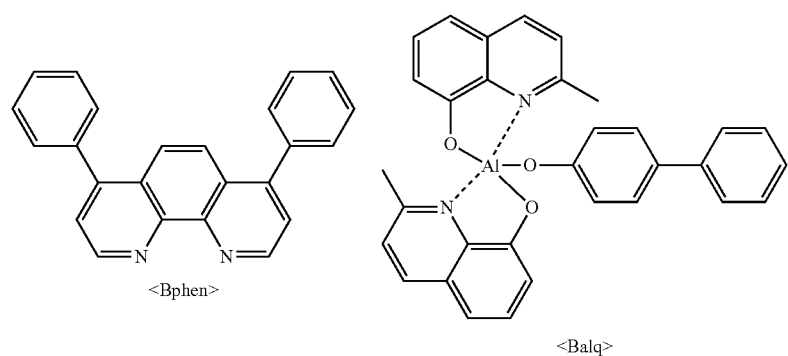
<Bphen>    <Balq>
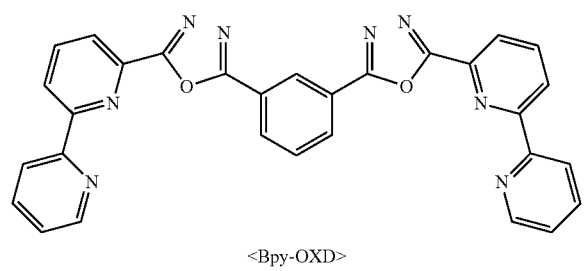
<Bpy-OXD>
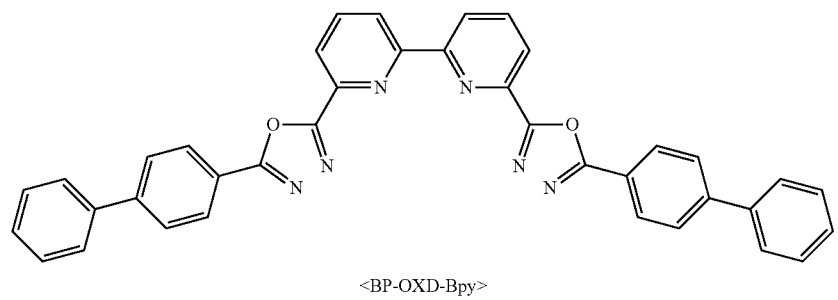
<BP-OXD-Bpy>
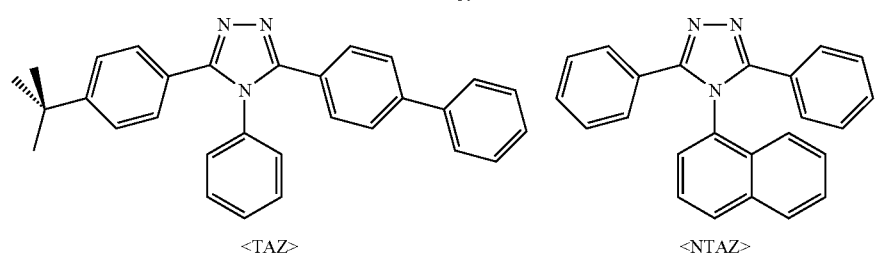
<TAZ>    <NTAZ>

-continued
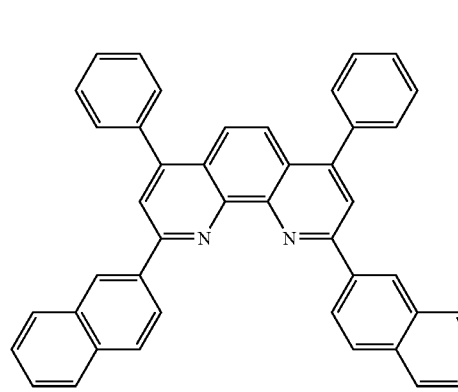
<NBphen>
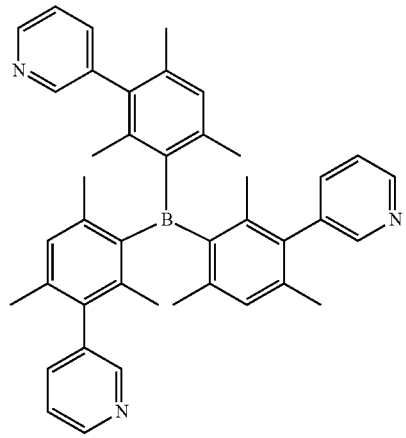
<3TPYMB>
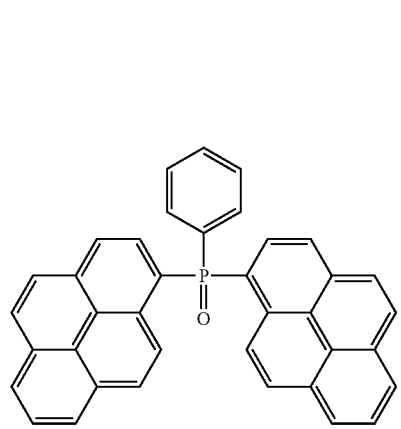
<POPy2>
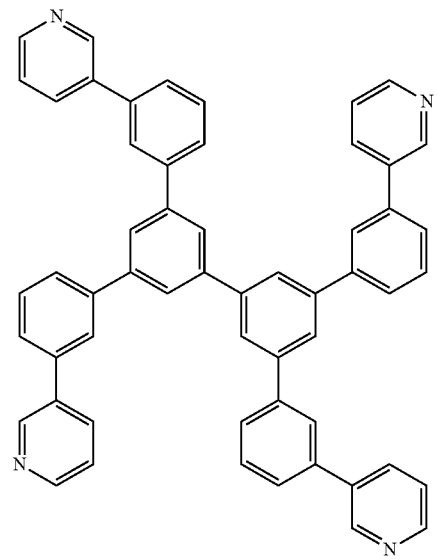
<BP4mPy>
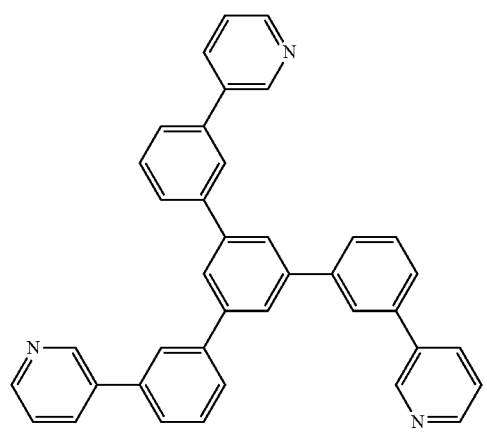
<TmPyPB>
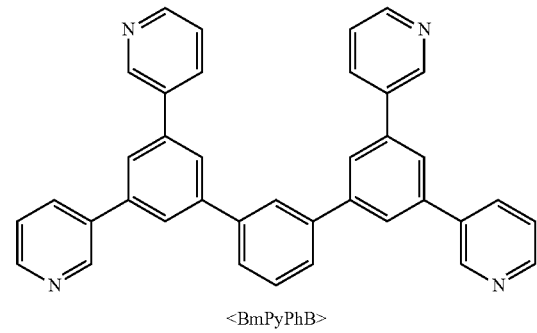
<BmPyPhB>

-continued

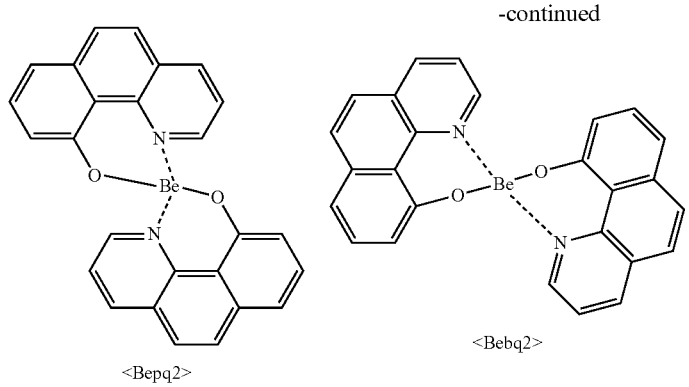

<Bepq2>  <Bebq2>

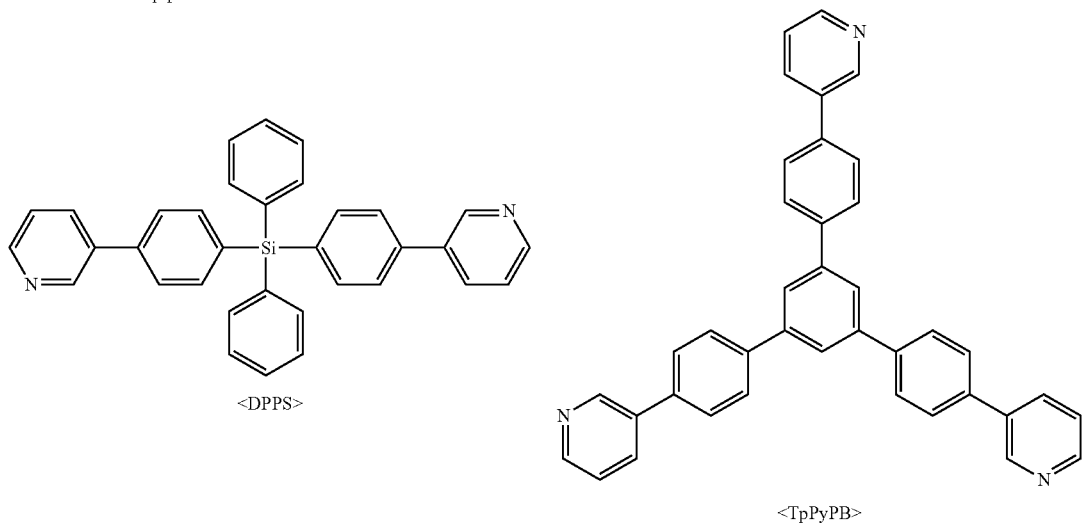

<DPPS>  <TpPyPB>

The electron transport layer may have a thickness of approximately 5 to 100 nm, for example, 15 to 60 nm. When the thickness of the electron transport layer satisfies the above range, an excellent electron transport characteristic may be obtained.

An electron-extraction interfacial layer may be formed on the electron transport layer. As a material for the electron-extraction interfacial layer, a known electron extraction material such as NaCl, $Li_2O$, BaO, or Liq (lithium quinolate) may be used in addition to the above-described materials, and conditions for depositing the electron-extraction interfacial layer may be changed according to a compound to be used, but generally selected from the conditions almost the same as those for forming an organic light active layer or a hole transport layer, except that a temperature is selected from 100 to 1500° C.

The electron-extraction interfacial layer may have a thickness of approximately 0.1 to 10 nm, for example, 0.5 to 5 nm. When the thickness of the electron-extraction interfacial layer satisfies the above range, a satisfactory electron extraction characteristic may be obtained.

In addition, the electron-extraction interfacial layer may include a metal derivative such as the LiF, NaCl, CsF, NaF, $Li_2O$, BaO, or $Cs_2CO_3$ in a content of 1 to 50% in a material for the electron transport layer such as $Alq_3$, TAZ, Balq, $Bebq_2$, BCP, TBPI, TmPyPB, or TpPyPB, and may be formed to have a thickness of 1 to 100 nm by doping a metal such as Li, Ca, Cs, or Mg on the material for the electron transport layer.

As a material for the transparent cathode used when the integrated conductive substrate 100 is used as an anode, a metal, an alloy, an electric conductive compound, or a combination thereof may be used. As a particular example, lithium (Li), magnesium (Mg), aluminum (Al), aluminum-lithium (Al—Li), calcium (Ca), magnesium-indium (Mg—In), or magnesium-silver (Mg—Ag) may be used. In addition, to obtain a front light injection photovoltaic cell, ITO or IZO may be used.

The above-described optical matching layer may be included on the transparent cathode layer used when the integrated conductive substrate 100 is used as an anode.

EXAMPLES

Example 1

Manufacture of Integrated Conductive Substrate

A stainless steel foil (thickness: 200 μm) having a first surface having a root mean square roughness (Rq) measured by an atomic force microscope of 25 nm was prepared as a conductive layer by preparing a commercially-available stainless steel foil (SUS 430, produced by Taewon Scientific Co. Ltd) having a surface having a root mean square roughness (Rq) measured by the atomic force microscope of 355 nm, and performing electro-polishing once.

Subsequently, an integrated conductive substrate was formed of a stainless steel foil conductive layer and a ZnO semiconductor layer (formed of a ZnO planarization layer)

by preparing a sol-gel first mixture by mixing zinc acetate dehydrate (Sigma Aldrich Inc.) with a mixed solvent of 2-methoxy ethanol and ethanol amine (0.1 g/ml, a volume ratio of 96:4), forming a semiconductor layer with a ZnO planarization layer having a thickness of 40 nm by spin-coating the sol-gel first mixture on a first surface of the stainless steel foil and performing thermal treatment at 350° C. for 10 minutes.

Manufacture of OPV

A silicon dioxide ($SiO_2$) pixel defining film (thickness: 350 nm) was formed on the ZnO semiconductor layer by a deposition method using a mask, and washed through sonication in acetone and isopropanol (IPA) for 20 minutes, respectively.

Afterward, a cesium carbonate ($Cs_2CO_3$) electron-extraction interfacial layer was formed to have a thickness of 5 nm on the semiconductor layer of the integrated conductive substrate having a patterned pixel defining film by spin-coating a solution prepared by dissolving $Cs_2CO_3$ in a 2-ethoxyethanol solvent at a concentration of 5 mg/ml.

A light active layer was formed to have a thickness of 80 nm on the $Cs_2CO_3$ electron-extraction interfacial layer without thermal treatment by spin-coating a solution prepared by dissolving poly[[9-(1-octylnonyl)-9H-carbazole-2,7-diyl]-2, 5-thiophenediyl-2,1,3-benzothiadiazole-4,7-diyl-2,5-thio-phenediyl] (PCDTBT) and phenyl-$C_{70}$-butyric acid methyl ester ($PC_{70}BM$) (a weight ratio of 1:4) in o-dichlorobenzene in a concentration of 7 mg/1 ml at 60° C. for 12 hours at 1600 rpm for 60 seconds, and performing thermal treatment at 80° C. for 20 minutes.

An $MoO_3$ hole extraction layer was formed to have a thickness of 5 nm by vacuum-depositing $MoO_3$ (deposition speed of 0.3 Å/s) on the light active layer.

A transparent anode was formed of Ag (15 nm) and $MoO_3$ (45 nm) by sequentially depositing Ag (deposition speed of 0.5 Å/s) and $MoO_3$ (deposition speed of 0.3 Å/s) on the $MoO_3$ hole extraction layer, and therefore an OPV was manufactured.

Components of the OPV were summarized, and are shown in Table 1.

TABLE 1

| Function | Material | Thickness |
|---|---|---|
| Transparent anode | Ag/$MoO_3$ | 15 nm/45 nm |
| Hole extraction layer | $MoO_3$ | 5 nm |
| Light active layer | PCDTBT:PC70BM | 80 nm |
| Electron-extraction interfacial layer | $Cs_2CO_3$ | 5 nm |
| Substrate and cathode | ZnO semiconductor layer (formed of a ZnO planarization layer) | 40 nm |
| | Stainless steel foil conductive layer | 0.2 mm |

A voltage-current density characteristic of the OPV of Example 1 was evaluated, and the result is summarized in Table 2. In the evaluation of the voltage-current density characteristic, the OPV was irradiated by light with an intensity of 100 mW/cm$^2$ using a xenon lamp as a light source (solar condition of the xenon lamp (AM1.5) was corrected using a standard photovoltaic cell).

Meanwhile, photoelectric conversion efficiency (PCE; %) was calculated from a short current ($J_{SC}$), an open-circuit voltage ($V_{OC}$), and a fill factor (FF), which were calculated from the measured voltage-current graph, and then summarized in Table 2.

TABLE 2

| Open-circuit voltage ($V_{OC}$) (V) | Short current ($J_{SC}$) (mA/cm$^2$) | Fill factor (FF) (%) | Photoelectric conversion efficiency (PCE) (%) |
|---|---|---|---|
| 0.53 | 0.82 | 53 | 2.3 |

From Table 2, it was confirmed that the OPV of Example 1 has excellent photoelectric conversion efficiency.

Example 2

Manufacture of Integrated Conductive Substrate

A stainless steel foil (thickness: 200 μm) having a first surface having a root mean square roughness (Rq) measured by an atomic force microscope of 30 nm was prepared as a conductive layer by preparing a commercially-available stainless steel foil having a surface having a root mean square roughness (Rq) measured by the atomic force microscope of 215 nm, and performing electro-polishing once as described in Example 1.

Subsequently, an integrated conductive substrate was formed of a stainless steel foil conductive layer and a ZnO semiconductor layer (formed of a ZnO planarization layer and a ZnO intermediate layer) by preparing a sol-gel first mixture by mixing zinc acetate dehydrate (Sigma Aldrich Inc.) with a mixed solvent of 2-methoxy ethanol and ethanol amine (0.1 g/ml, a volume ratio of 96:4), forming a ZnO planarization layer having a thickness of 30 nm by spin-coating the sol-gel first mixture on a first surface of the stainless steel foil and performing thermal treatment at 350° C. for 10 minutes, and forming a ZnO intermediate layer having a thickness of 20 nm by depositing ZnO on the ZnO planarization layer using a sputtering deposition method.

Manufacture of OPV

An OPV was manufactured on the integrated conductive substrate using the same method as described in Example 1.

Components of the OPV were summarized as shown in Table 3.

TABLE 3

| Function | Material | | Thickness |
|---|---|---|---|
| Transparent anode | Ag/$MoO_3$ | | 15 nm/45 nm |
| Hole extraction layer | $MoO_3$ | | 5 nm |
| Light active layer | PCDTBT:PC70BM | | 80 nm |
| Electron-extraction interfacial layer | $Cs_2CO_3$ | | 5 nm |
| Substrate and Cathode | ZnO semiconductor layer | ZnO intermediate layer[2] | 20 nm |
| | | ZnO planarization layer[1] | 30 nm |
| | Stainless steel foil conductive layer | | 0.2 mm |

[1]formed using a solution process
[2]formed using a sputter deposition method

A voltage-current density characteristic of the OPV of Example 2 was evaluated, and the result is summarized in Table 4. In the evaluation of the voltage-current density characteristic, the OPV was irradiated by light with an intensity of 100 mW/cm$^2$ using a xenon lamp as a light source (solar condition of the xenon lamp (AM1.5) was corrected using a standard photovoltaic cell).

Meanwhile, photoelectric conversion efficiency (PCE; %) was calculated from a short current ($J_{SC}$), an open-circuit voltage ($V_{OC}$), and a fill factor (FF), which were calculated from the measured voltage-current graph, and then summarized in Table 4.

TABLE 4

| Open-circuit voltage ($V_{OC}$) (V) | Short current ($J_{SC}$) (mA/cm²) | Fill factor (FF) (%) | Photoelectric conversion efficiency (PCE) (%) |
|---|---|---|---|
| 0.55 | 0.85 | 55 | 2.57 |

From Table 4, it was confirmed that the OPV of Example 2 has excellent photoelectric conversion efficiency.

Example 3

Manufacture of Integrated Conductive Substrate

A stainless steel foil (thickness: 200 μm) having a first surface having a root mean square roughness (Rq) measured by an atomic force microscope of 30 nm was prepared as a conductive layer by preparing a commercially-available stainless steel foil having a surface having a root mean square roughness (Rq) measured by the atomic force microscope of 215 nm, and performing electro-polishing once as described in Example 1.

Subsequently, an integrated conductive substrate was formed of a stainless steel foil conductive layer and a ZnO semiconductor layer (formed of a ZnO intermediate layer and a ZnO planarization layer) by forming a ZnO intermediate layer having a thickness of 20 nm by depositing ZnO on a first surface of the stainless steel foil using a sputter deposition method, and forming a ZnO planarization layer having a thickness of 30 nm by spin-coating a sol-gel first mixture prepared by mixing zinc acetate dehydrate (Sigma Aldrich Inc.) with a mixed solvent of 2-methoxy ethanol and ethanol amine (0.1 g/ml, a volume ratio of 96:4) on the ZnO intermediate layer and performing thermal treatment at 350° C. for 10 minutes.

Manufacture of OPV

An OPV was manufactured on the integrated conductive substrate using the same method as described in Example 1.

Components of the OPV were summarized as shown in Table 5.

TABLE 5

| Function | Material | | Thickness |
|---|---|---|---|
| Transparent anode | Ag/MoO₃ | | 15 nm/45 nm |
| Hole extraction layer | MoO₃ | | 5 nm |
| Light active layer | PCDTBT:PC70BM | | 80 nm |
| Electron-extraction interfacial layer | Cs₂CO₃ | | 5 nm |
| Substrate and Cathode | ZnO semiconductor layer | ZnO planarization layer[4] | 30 nm |
| | | ZnO intermediate layer[3] | 20 nm |
| | Stainless steel foil conductive layer | | 0.2 mm |

[3]formed using a sputter deposition method
[4]formed using a solution process

A voltage-current density characteristic of the OPV of Example 3 was evaluated, and the result is summarized in Table 6. In the evaluation of the voltage-current density characteristic, the OPV was irradiated by light with an intensity of 100 mW/cm² using a xenon lamp as a light source (solar condition of the xenon lamp (AM1.5) was corrected using a standard photovoltaic cell).

Meanwhile, photoelectric conversion efficiency (PCE; %) was calculated from a short current ($J_{SC}$), an open-circuit voltage ($V_{OC}$), and a fill factor (FF), which were calculated from the measured voltage-current graph, and then summarized in Table 6.

TABLE 6

| Open-circuit voltage ($V_{OC}$) (V) | Short current ($J_{SC}$) (mA/cm²) | Fill factor (FF) (%) | Photoelectric conversion efficiency (PCE) (%) |
|---|---|---|---|
| 0.52 | 0.82 | 56 | 2.38 |

From Table 6, it was confirmed that the OPV of Example 3 has excellent photoelectric conversion efficiency.

The present invention relates to a substrate, an electrode, and an OPV.

While the invention has been shown and described with reference to certain exemplary embodiments thereof, it will be understood by those skilled in the art that various modifications in form and details may be made therein without departing from the spirit and scope of the invention as defined by the appended claims.

The invention claimed is:

1. A conductive substrate comprising:
   a conductive layer comprising iron, the conductive layer comprising a first surface having a first root mean square roughness (Rq); a first semiconductor layer formed on the first surface of the conductive layer using a liquid application process that applies liquid containing a first semiconductive material on the first surface to form the first semiconductor layer, the first semiconductor layer comprising a second surface facing away from the first surface, the second surface having a second root mean square roughness; and
   a second semiconductor layer formed on the second surface using a non-liquid deposition process that deposits a second semiconductive material to form the second semiconductor layer, the second semiconductor layer comprising a third surface facing away from the second surface, the third surface having a third root mean square roughness,
   wherein the second surface of the first semiconductor layer does not follow a morphology of the first surface due to the liquid application process of forming the first semiconductor layer, and accordingly the second root mean square roughness is substantially different from and smaller than the first root mean square roughness, whereas the third surface of the second semiconductor layer generally follows a morphology of the second surface due to the non-liquid deposition process, and accordingly the third root mean square roughness is substantially different from and smaller than the first root mean square roughness.

2. The substrate according to claim 1, wherein the first root mean square roughness is 10 nm or more, and the second root mean square roughness is less than 10 nm.

3. The substrate according to claim 1, wherein the first semiconductive material is different from the second semiconductive material.

4. The substrate according to claim 3, wherein the second root mean square roughness of the second surface is substantially equal to the third root mean square roughness of the third surface.

5. The substrate according to claim 1, wherein the conductive layer includes at least one material selected from steel, carbon steel, special steel, stainless steel, cast iron, and steel casting.

6. The substrate according to claim 1, wherein at least one of the first and second semiconductor layers includes at least one selected from the group consisting of $TiO_x$ (x is a real number of 1 to 3), indium oxide ($In_2O_3$), tin oxide ($SnO_2$), zinc oxide (ZnO), zinc tin oxide, gallium oxide ($Ga_2O_3$), tungsten oxide ($WO_3$), aluminum oxide, titanium oxide, vanadium oxide ($V_2O_5$, $VO_2$, $V_4O_7$, $V_5O_9$, or $V_2O_3$), molybdenum oxide ($MoO_3$ or $MoO_x$), copper (II) oxide (CuO), nickel oxide (NiO), copper aluminum oxide (CAO; $CuAlO_2$), zinc rhodium oxide (ZRO; $ZnRh_2O_4$), iron oxide, chromium oxide, bismuth oxide, indium-Gallium Zinc Oxide (IGZO), and $ZrO_2$.

7. The substrate according to claim 1, wherein the conductive layer has a thickness of 50 nm to 5 mm, and the first and second semiconductor layers have a thickness of 5 to 300 nm.

8. An electronic device comprising the conductive substrate of claim 1.

9. The device according to claim 8, wherein the conductive layer of the conductive substrate comprises a bottom surface that faces away from the first surface and is exposed to air without contacting an object.

10. A flexible inverted organic photovoltaic cell, comprising:
   the conductive substrate of claim 1;
   a transparent anode placed over the third surface of the second semiconductor layer; and
   a light active layer interposed between the second semiconductor layer and the transparent anode,
   wherein the conductive substrate serves as both a substrate for supporting the organic photovoltaic cell and a cathode of the organic photovoltaic cell.

11. The organic photovoltaic cell of claim 10, wherein the metal layer of the conductive substrate comprises a bottom surface that faces away from the first surface and is exposed to air without contacting an object.

12. A flexible normal-structure organic photovoltaic cell, comprising:
   the conductive substrate of claim 1;
   a transparent cathode placed over the third surface of the second semiconductor layer; and
   a light active layer interposed between the second semiconductor layer and the transparent cathode,
   wherein the conductive substrate serves as both a substrate for supporting the organic photovoltaic cell and an anode of the photovoltaic cell.

13. The organic photovoltaic cell of claim 12, wherein the metal layer of the conductive substrate comprises a bottom surface that faces away from the first surface and is exposed to air without contacting an object.

* * * * *